United States Patent [19]
Jazayeri et al.

[11] Patent Number: 5,587,951
[45] Date of Patent: Dec. 24, 1996

[54] HIGH SPEED, LOW VOLTAGE NON-VOLATILE MEMORY

[75] Inventors: Mehdi Jazayeri; Edward S. Hui, both of Cupertino; George J. Korsh, Redwood City, all of Calif.

[73] Assignee: Atmel Corporation, San Jose, Calif.

[21] Appl. No.: 511,311

[22] Filed: Aug. 4, 1995

[51] Int. Cl.$^6$ .................................................. G11C 13/00
[52] U.S. Cl. .......................................... 365/203; 365/226
[58] Field of Search .............................. 365/182, 189.01, 365/230.01, 203, 226, 227, 228

[56] References Cited

U.S. PATENT DOCUMENTS

| | | | |
|---|---|---|---|
| 5,168,466 | 12/1992 | Kuo et al. | 365/189.01 |
| 5,226,013 | 7/1993 | Secol et al. | 365/203 |
| 5,331,295 | 7/1994 | Jelinek et al. | 331/57 |
| 5,367,206 | 11/1994 | Yu et al. | 326/26 |

OTHER PUBLICATIONS

Article entitled "ASICs spreading throughout system design", *Electronic Engineering Times*, May 10, 1993, pp. 54 & 58.

*Primary Examiner*—Terrell W. Fears
*Attorney, Agent, or Firm*—Thomas Schneck

[57] ABSTRACT

A low voltage EPROM which increases its reading speed by charging a word line to a voltage higher than vcc during a read operation. Two voltage pumps, which alternately place charge on a word line, receive control signals of opposite phase from a temperature insensitive oscillator. The voltage from the two voltage pumps passes through a zero threshold voltage n-type pass device to a word line. The zero threshold voltage n-type pass device receives its control signal from a third voltage pump. In order to make the low voltage EPROM compatible with standard 5V programmers, each output driving circuit consists of a large output driver used under low voltage $V_{cc}$ conditions and a smaller output driver used under standard 5V $V_{cc}$ conditions.

34 Claims, 5 Drawing Sheets

HIGH SPEED, LOW VOLTAGE NON-VOLATILE MEMORY

TECHNICAL FIELD

The invention relates to low voltage semiconductor non-volatile memories such as EPROMs, EEPROMs, and flash EEPROMs.

BACKGROUND ART

A major benefit of going from a standard five volt EPROM, with a $V_{cc}$ voltage range of 4.5 to 5.5 volts, to a low voltage EPROM, with an unregulated $V_{cc}$ voltage range of 2.7 to 3.6, is that the low voltage EPROM consumes much less power. But several problems are encountered when making such a $V_{cc}$ voltage transition.

First of all, older programming machines, known as EPROM programmers, are designed to program standard five volt EPROMs, and are generally not compatible with newer low voltage EPROMs due primarily to two independent problems. The first problem concerns an EPROM's output drivers. Speed is a major concern for low voltage EPROMs, and an EPROM's output driver is a major component in the determination of an EPROM's read access time. To compensate for a lower $V_{cc}$ value, low voltage EPROMs incorporate large output drivers with large current driving capabilities which provide for faster rise and fall slew rates at a given vcc value. However, standard EPROM programmers typically use an $V_{cc}$ value of 6 V or higher to verify a programming instruction. This high $V_{cc}$ value can cause ringing and signal bouncing in a low voltage EPROM with large output drivers or even damage the EPROM. One way of solving this problem is to reduce the current driving capability of a low voltage EPROM, but this adversely affects the EPROM's speed.

The second problem facing the use of low voltage EPROMs on standard 5 V EPROM programmers is the programmers' algorithm itself. EPROM memories determine the logic level of a storage cell by comparing the amount of current a storage cell can source with a reference current. If the storage cell sources more current than the reference current then it is classified as erased, but if it sources less current than the reference current then it is classified as programmed. It is possible for an erased cell to be partially programmed by an EPROM programmer when it is intended to remain erased. This means that the cell's threshold voltage has been slightly raised, but is still sufficiently low to source enough current for the EPROM programmer to verify the cell as erased when it is verified with $V_{cc}$ set to 6 V or higher. When the same EPROM is set to function under low voltage $V_{cc}$ conditions of 2.7 V to 3.6 V, the same memory cell which tested as having been erased under high $V_{cc}$ conditions may no longer be able to source enough current to read as erased and will instead be read as programmed. Thus it is possible for a cell to verify correct data under high $V_{cc}$ conditions, but to yield incorrect data under low $V_{cc}$ conditions. These two problems hinder users of low voltage EPROMs unless users replace or modify their older EPROM programmers to work with low voltage EPROMs.

Furthermore, the benefit of lower power consumption resulting from going from a standard five volt EPROM to a low voltage EPROM is usually accompanied by a degradation in the EPROM's performance. A lower $V_{cc}$ voltage results in a lower voltage on a cell's word line which translates into a lower memory cell current. A lower memory cell current, in turn, means slower read times since the memory requires more time to determine whether the cell is sourcing enough current to be classified as erased or programmed. This problem not only reduces the speed of the memory, but also reduces manufacturing yield, and generally degrades the overall performance of the memory.

Moreover, low voltage EPROMs may use voltage pumps to raise the memory's internal voltage to a high voltage for programming operations. These voltage pumps are controlled by oscillators which dictate the intervals at which charge is transferred to a voltage pumps's charge storing capacitors. The oscillators are, in turn, very susceptible to $V_{cc}$ and temperature variations. This, however, has typically not been a problem in prior art EPROMs since the voltage pumps are used only during a programming operation and such operations make up a small fraction of an EPROM's operation time.

Other low voltage memories, such as low voltage EEPROMs and flash EEPROMs, share some of the same problems afflicting low voltage EPROMs. Like low voltage EPROMs, low voltage EEPROMs and flash EEPROMs incorporate large output drivers with high current driving capabilities to compensate for a lower $V_{cc}$ value. If it is desired to use a low voltage EEPROM or low voltage flash EEPROM within a standard 5 V $V_{cc}$ environment, the relatively high value of $V_{cc}$ may cause the large output drivers to have noise problems such as ringing and signal bouncing. Similarly, EEPROMs and flash EEPROMs determine a memory cell's logic level by comparing the memory cell's current sourcing ability with a reference·current. Therefore, low voltage EEPROMs and flash EEPROMs suffer from the same problems of slower read times and misread data which afflict low voltage EPROMs, as explained above.

Manufacturers have taken different approaches toward mitigating the adverse effects of low voltage EPROMs. U.S. Pat No. 5,226,013 to Secol et al. describes a means of speeding up an EPROM by precharging a bit line, amplifying the voltage imbalance between the bit line voltage and a reference voltage, and terminating the charging of said bit line as soon as a sensing amplifier has read the cell. U.S. Pat. No. 5,367,206 to Yu et al. discloses an output driver circuit designed to interface a low voltage EPROM with a standard 5 volt EPROM programmer by incorporating circuitry that slows down an output driver during a standard 5 V $V_{cc}$ programming operation, but speeds up the output driver during low voltage $V_{cc}$ conditions. U.S. Pat. No. 5,331,295 to Jelinek further describes an oscillator with temperature, voltage, and process compensation. An article in EE Times dated May 10, 1993 discusses an EPROM developed by Toshiba Corp. which can function with $V_{cc}$ set to a range of 1.5 to 6 volts. The low end voltage of 1.5 V is below the threshold voltage of an EPROM cell, and therefore a word line boost technique is used to raise the word line voltage to a reading voltage of 4 V. The boosted voltage is applied to the word lines through a decoder which switches from a programming voltage of 12.5 V to a reading voltage of 4 V. Although the article did not describe Toshiba's circuitry, it did note that their technique is restricted to consumer or ASIC applications, which have limited EPROM densities.

It is an object of this invention to provide a mechanism for improving the read access time of low voltage non-volatile memories.

It is another object of this invention to provide a low voltage EPROM compatible with standard 5 volt EPROM programmers while providing increased speed and performance.

DISCLOSURE OF THE INVENTION

The above object has been met in a low voltage non-volatile EPROM memory which monitors its $V_{cc}$ voltage level and selectively enables and disables certain circuitry to enhance the performance of the memory under standard 5 V $V_{cc}$ and low voltage $V_{cc}$ conditions.

The speed at which a non-volatile silicon memory functions is largely determined by how quickly it can compare the current being sourced by a storage cell with a reference current and reach a decision regarding the logic level of the storage cell. In turn, the speed at which a non-volatile silicon memory can make this comparison is dependent on a storage cell's current sourcing ability, which is directly related to the voltage level on its word line.

Normally, the voltage level on a word line is near $V_{cc}$. If $V_{cc}$ is within the standard 5 V voltage range of 4.5 V to 5.5 V, a word line can supply enough voltage to a storage cell to allow it a quick response time. But if $V_{cc}$ is lowered to a voltage range of 2.7 V to 3.6 V, as is the case in commercially available low voltage memories, the voltage on a word line is likewise reduced to a similar voltage range. The lower voltage reduces a storage cells ability to source current, and the reduction in current increases the time the non-volatile memory needs to determine the storage cell's logic level thereby resulting in a memory of slower performance.

Under standard 5 V operating conditions, the memory of the present invention functions as any standard 5 volt non-volatile silicon memory by using the $V_{cc}$ power rail directly to raise a word line to a similar voltage. Since $V_{cc}$ is near five volts, the output drivers should not be as large as in low voltage conditions, or noise problems may develop. Therefore, the memory incorporates two output drivers, one smaller and slower than the other, per output lead. When the non-volatile memory is placed under standard 5 V $V_{cc}$ conditions, it uses the smaller output drivers, and when it is placed under low voltage $V_{cc}$ conditions, it uses the larger, and faster, output drivers.

To compensate for the lowering of $V_{cc}$ during low voltage operations, the non-volatile memory of the present invention internally raises the voltage of a word line during a read operation to a value higher than $V_{cc}$, preferably 3.5 V to 5.5 V. By raising the internal word line bias to a voltage range similar to that of standard 5 V $V_{cc}$ conditions, the memory of the present invention not only maintains a similar high speed, but also eliminates any faulty reading conditions that can arise from programming a low voltage EPROM cell using standard 5 V EPROM programmers but reading the low voltage EPROM cell under low voltage conditions.

This is accomplished with the use of a word line bias circuit consisting of three read voltage pumps and a read oscillator common to all three read voltage pumps. The three read voltage pumps are active solely during reading operations, and each receives a control signal from the common read oscillator, used exclusively for the read voltage pumps. The frequency of the read oscillator is controlled by a temperature insensitive current source which maintains the frequency of the read oscillator relatively stable in spite of any voltage or temperature variations and thereby reduces unnecessary increases in power consumption. To further conserve power, the read voltage pumps, read oscillator, and temperature insensitive current source are enabled only during a read operation, and they are further disabled when the memory is in a standby mode or when $V_{cc}$ is raised above low voltage $V_{cc}$ conditions.

Two of the three read voltage pumps operate in conjunction with each other to more quickly respond to the read oscillator and begin charging a word line. The control signals to these two read voltage pumps have similar frequencies but opposite phases. In this way, one of the two read voltage pumps is transferring charge onto a storage capacitor during either half of the read oscillator's cycle. This feature reduces the read access time since no time is wasted in initiating the charging of a word line from the instant a read instruction is first received.

The charging of a word line, and therefore the speed of the non-volatile memory, is further enhanced by a high voltage decoder used to selectively transfer a voltage from the two read voltage pumps working in conjunction with each other to a word line with minimal distortion. The high voltage decoder generates multiple outputs, and each output utilizes a one shot circuit. The one shot circuit is used to precharge a high voltage decoder output to $V_{cc}$, and then to transfer control to the two read voltage pumps working in conjunction with each other, which continue charging the decoder output to a value higher than $V_{cc}$.

Each high voltage decoder output is applied to native pass transistors which couple a decoder output voltage to a corresponding word line. Native pass transistors are n-type devices built directly on a silicon substrate and have a threshold voltage of 0 V.

The use of native n-type transistors as pass devices does have one draw back. Unselected pass devices have zero volts applied to their control gate, but since the threshold voltage of native pass devices is 0 V, unselected devices with 0 V at their control gates are not in a fully "off" state and can therefore cause undesirable leakage current. To resolve this problem, native pass devices are coupled through normal n-type pass transistors to a grounding line, VS, which is kept at a voltage slightly higher than 0 V by a VS generator. Thus, when a native pass device is not selected, a voltage higher than ground is applied to its source electrode placing the native pass device in a fully "off" state.

These native pass devices have their control gate indirectly coupled to the output of a third read voltage pump. A high voltage on their control gate allows the native pass devices to transfer a high voltage signal from a decoder output to their corresponding word line. Further, the voltage value transferred is controlled by the voltage on their control gate. Thus, during a reading operation, the voltage applied to a word line is limited to the voltage on the output of the third read voltage pump.

The voltage level on the output of the third read voltage pump is regulated by a feedback circuit which monitors the pump's output voltage. When the output voltage from the third read voltage pump goes above a predetermined voltage range, the feed back circuit disables the third read voltage pump allowing the pump to start discharging through a leaker transistor. A clamping diode, however, does not allow the third read voltage pump to discharge below $V_{cc}$. Once the voltage level falls within said predetermined voltage range, the feedback circuit once again enables the third read voltage pump and disables the small leaker transistor.

BEST MODE OF CARRYING OUT THE INVENTION

Figure 1:
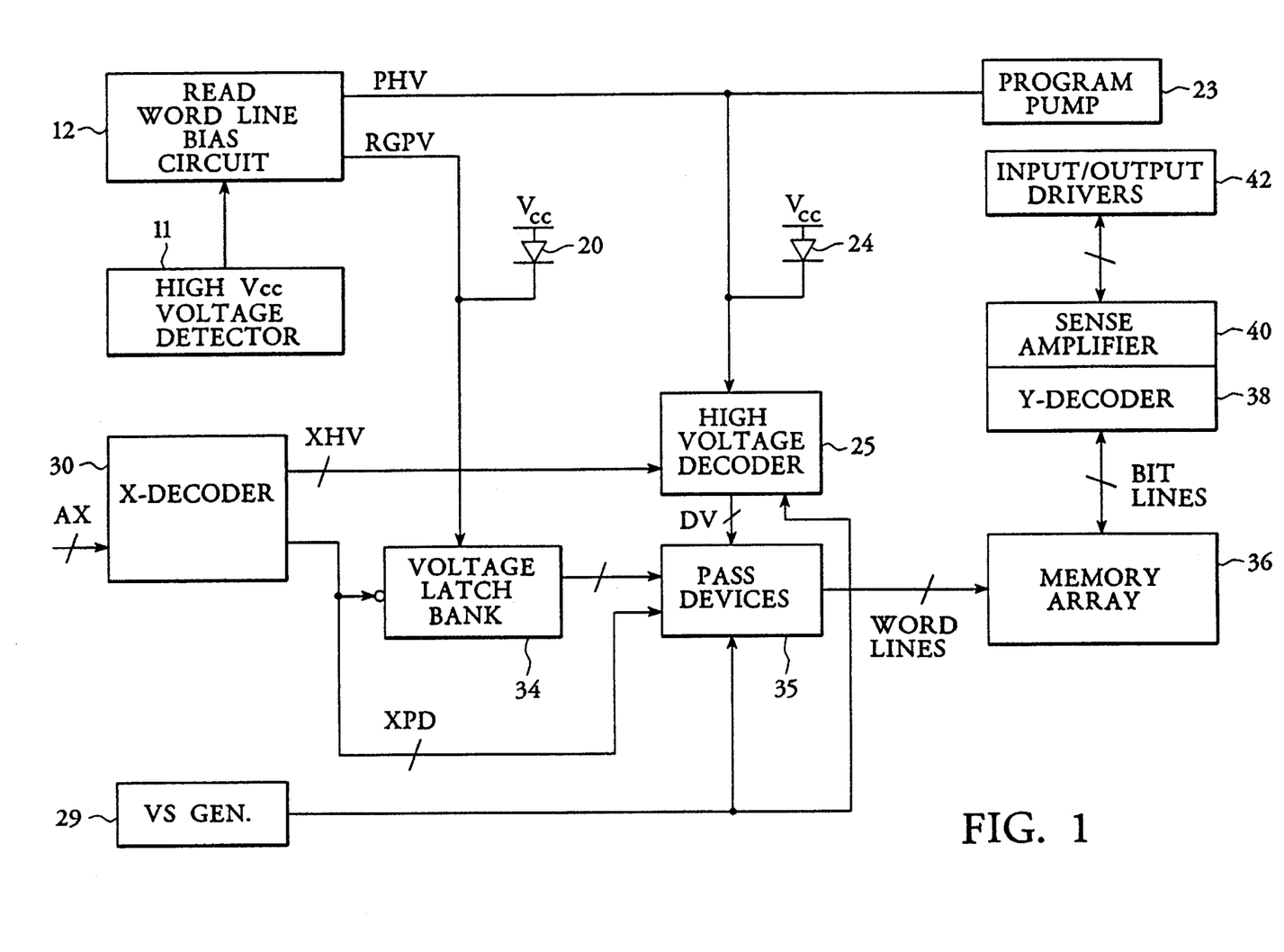
FIG. 1 is a block diagram of a memory in accord with the present invention.

With reference to FIG. 1, multiple memory cells are arranged in rows and columns to form a memory core array 36. The memory cells are addressable by means of word lines to select a row of memory cells, and bit lines to select a column of memory cells. An addressed memory cell is located at an intersection of a word line and a bit line. Each memory cell has a numerical address which is divided into two groups, an X-address to identify one row, or word line, of memory cells and a Y-address to identify one column, or bit line, or memory cells. The X-address lines, AX, are fed to an X-decoder 30 to select a word line, and the Y-address is decoded by a Y-decoder 38 to select a bit line. After a memory cell has been selected, current through the selected memory cell is compared to a reference current by a sense amplifier 40. If the selected cell is identified as erased, a predetermined first logic level, high or low, is sent to a set of input/output drivers 42. If the selected cell is identified as programmed, a second logic level opposite the first logic level is sent to the input/output drivers 42.

The present invention further incorporates circuitry for raising the bias, or voltage, level applied to a word line to a level higher than $V_{cc}$, the input power signal, during a read operation when $V_{cc}$ is set to low voltage conditions of preferably 2.7 V to 3.6 V. When $V_{cc}$ is set to standard 5 V voltage conditions of 4.5 V or higher, the aforementioned incorporated circuit for raising the bias level of a word line is deactivated and the memory uses $V_{cc}$ directly to bias a word line.

With reference to FIG. 1, a high $V_{cc}$ voltage detector 11 monitors the $V_{cc}$ power rail. If $V_{cc}$ is set to low voltage conditions, the high $V_{cc}$ voltage detector 11 will enable a read word line bias circuit 12 which will output two signals, PHV and RGPV. Both, signals PHV and RGPV, have voltage values higher than $V_{cc}$ and can be made equal to each other, but preferably signal PHV is made to have a voltage higher than signal RGPV.

Figure 2:
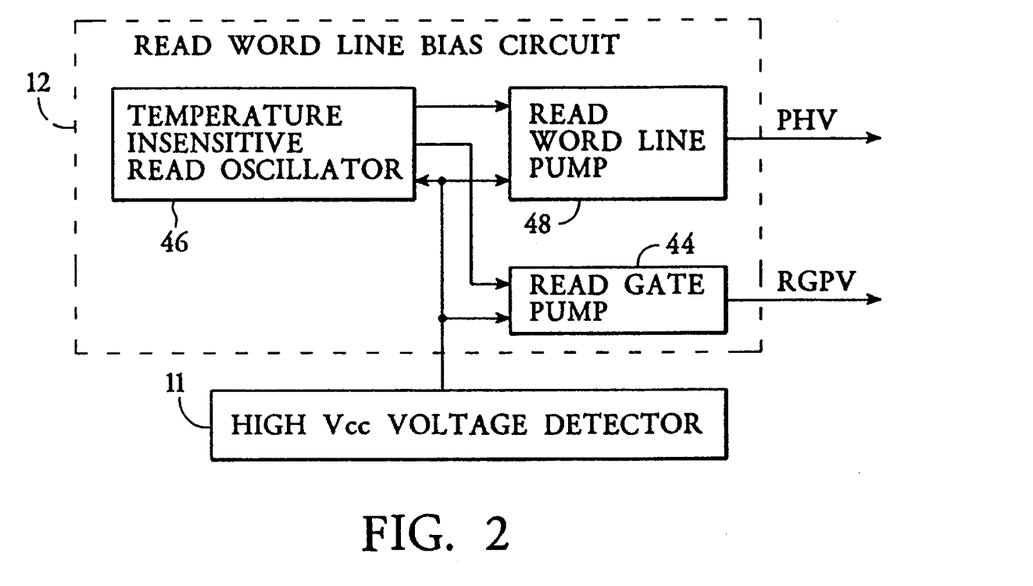
FIG. 2 is an internal view of the read word line bias circuit shown in FIG. 1.

In FIG. 2, an internal view of a word line bias circuit 12 in accord with the present invention comprises two separate voltage pumps; a read word line pump 48 for generating a pump high voltage signal, PHV, and a read gate pump 44 for generating a read gate pump voltage signal, RGPV. However, if signals PHV and RGPV were to have the same value, the voltage pumps 48 and 44 could be replaced by a single voltage pump. The read word line pump 48 and the read gate pump 44 both receive control inputs from a temperature insensitive read oscillator 46 which controls a charge pumping frequency of both voltage pumps. All three components within the read word line bias circuit 12; the temperature insensitive read oscillator 46, the read word line pump 48 and the read gate pump 44 receive an enable input from the high voltage detector 11.

With reference to FIG. 1, signal PHV is preferably made to have a value of 7 V and is connected directly to a high voltage decoder 25 and to the output of a program pump 23. Although the output from the program pump 23 may be higher than the output from the read word line bias circuit 12, no contingency problems arise since the read word line bias circuit 12 is active only during a read operation as determined by an input pin, not shown, and the program pump 23 is active only during a program operation as determined by the same input pin. Signal RGPV, preferably having a voltage of 4.5 V, goes through a voltage latch bank 34 to a control input of a set of pass devices 35.

The X-decoder 30 decodes a word line address, AX, into two sets of signals; X-high voltage, XHV, which are fed to the high voltage decoder 25 and X-pass device, XPD, which are sent to the voltage latch bank 34 and to the pass devices 35. The high voltage decoder 25 will transfer the pumped high voltage line, PHV, to one of its output lines, DV, in response to the XHV lines. The voltage latch bank 34 will transfer the read gate pump voltage signal, RGPV, to one of its outputs as determined by the XPD lines. The pass devices 35 thus receive the PHV signal along one of the DV lines and the RGPV signal along one of the outputs from the voltage latch bank 34. The pass devices 35 then couple one of the DV lines, carrying signal PHV, to a single word line as determined by the voltage latch bank 34 and the XPD lines. The pass devices 35, however, are made to limit the voltage at their outputs, the word lines, to a value similar to RGPV. In this manner, a selected word line will receive a voltage value similar to RGPV of about 4.5 V.

A VS generator 29 outputs a voltage slightly higher than ground needed for proper operation of the high voltage decoder 25 and the pass devices 35, as explained below.

Figure 3:
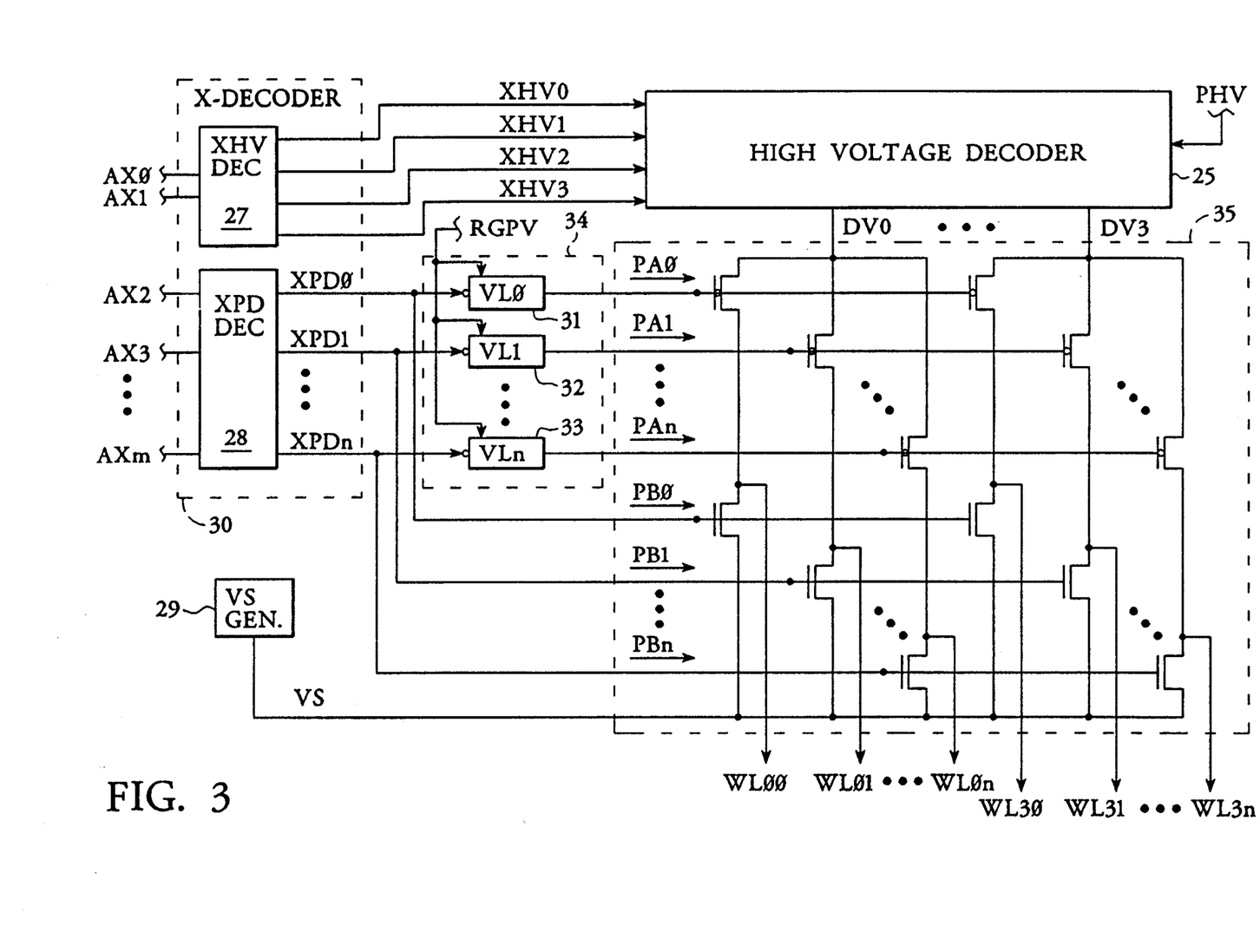
FIG. 3 is a schematic of a word line address decoding scheme in accord with the present invention.

In FIG. 3, a preferred word line decoding scheme is shown to consist of multiple decoding stages. The X-decoder 30 separates a word line address, AX0–AXm, into two groups. The first group, consisting of address lines AX0 and AX1, are sent to an XHV decoder 27, which acts as a two to four decoder to generate four output signals, XHV0–XHV3. The second group, consisting of address lines AX2–AXm, go to XPD decoder 28 whose output signals XPD0–XPDn are fed to the voltage latch bank 34 and the pass devices 35.

The pass devices 35 couple line PHV to a word line by means of the high voltage decoder 25, voltage latch bank 34, and XPD decoder 28. Signal XHV0–XHV3 are fed to the high voltage decoder 25, which transfers signal PHV to one of its four outputs, DV0–DV3, as dictated by signals XHV0–XHV3. Each of the four high voltage decoder outputs, DV0–DV3, is selectively coupled to a group of n word lines by means of pass devices PA0–PAn and PB0–PBn. For example, line DV0 can selectively be coupled to word lines WL00–WL0n and line DV3 can be coupled to word lines WL30–WL3n. The pass devices 35 further gather a word line from each DV0–DV3 group into sets of four which can be collectively selected by a voltage latch within the voltage latch bank 34. Thus, the XHV decoder 27 selects one of four groups of n word lines coupled to one of the four high voltage decoder outputs, DV0–DV3 and the XPD decoder 28 selects a single word line from within the selected group of word lines. The XPD decoder activates a single voltage latch, VL0–VLn, 31–33 respectively, from within the voltage latch bank 34, which transfers signal RGPV to the control gate of the corresponding PA pass device while signals XPD1–XPDn couple the remaining, unselected word lines to the VS generator 29.

The PA pass devices in the preferred decoding scheme consist of native n-type pass transistors with a threshold voltage of 0 V. As a result, the PA pass devices require that a positive voltage be applied to their source electrode to place them in a fully "off" state, as explained below. Therefore, the VS generator 29 outputs a VS signal slightly above ground potential which is applied to the source electrode of the PA pass devices by means of corresponding PB pass devices. If signal VS were not applied to the source electrodes of the unselected PA pass devices, each unselected PA pass device would have a small conductive current, or leakage current, when it is intended to be off and have no current. Since a large plurality of PA pass devices may be used in the decoding of a word line, the collective leakage current from all unselected PA pass devices would cause an unacceptably high power loss.

Returning to FIG. 1, if $V_{cc}$ is set to standard voltage conditions of 4.5 V or higher, the high $V_{cc}$ voltage detector 11 will disable the read word line bias circuit 12 which will cause the PHV and RGPV signals to start discharging. In order to couple the high voltage decoder 25 and the pass devices 35 to the $V_{cc}$ power rail during standard 5V voltage conditions, clamping diodes 20 and 24 clamp signals RGPV and PHV, respectively, to $V_{cc}$ when they discharge down to a value similar to $V_{cc}$.

Figure 4:
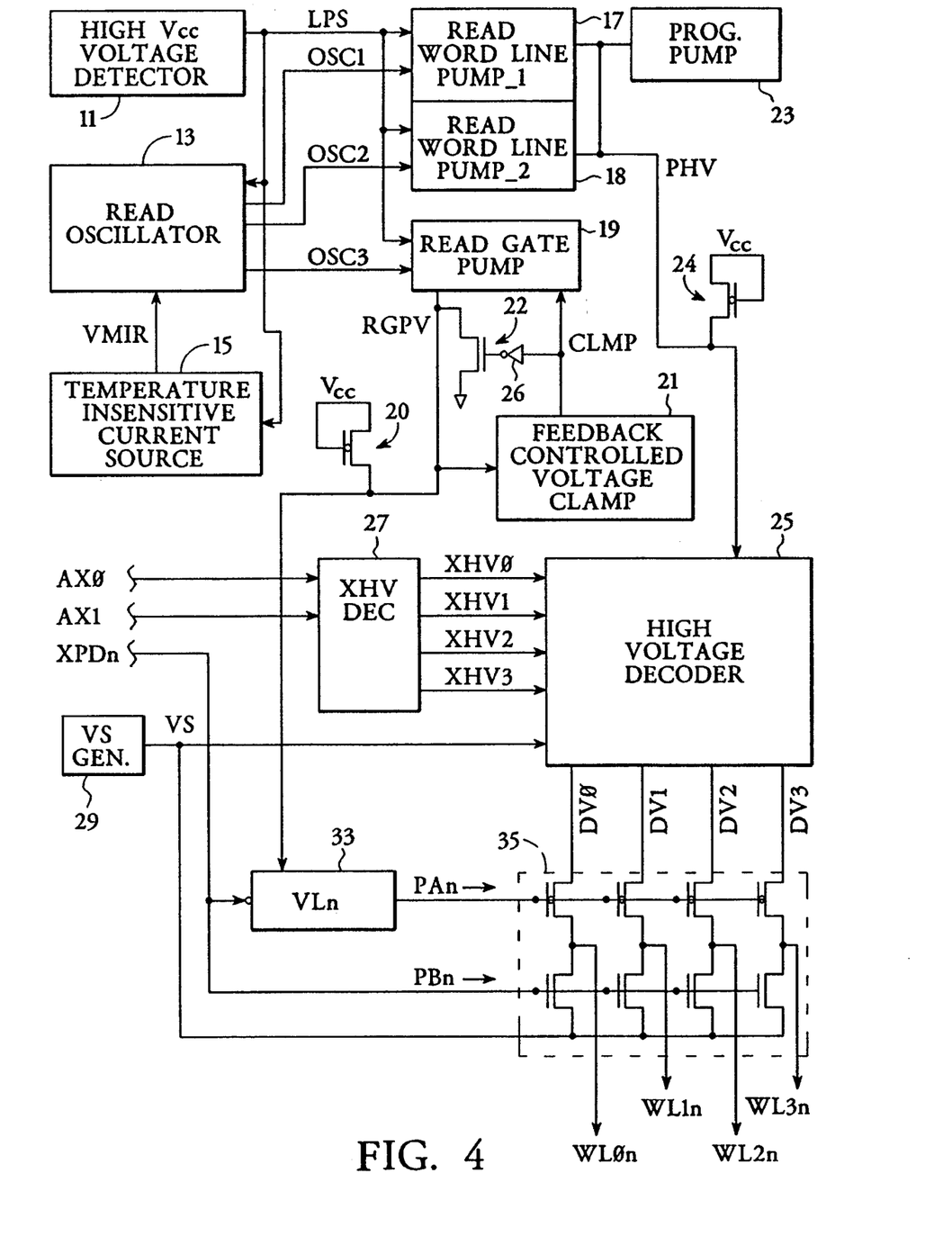
FIG. 4 is a functional block diagram of a preferred circuit for transferring a high voltage to a word line during a read operation in accord with the present invention.

With reference to FIG. 4, to simplify a discussion of the preferred method of transferring a high voltage to a word line during a read operation, only a single word line, WL0n–WL3n per high voltage decoder output DV0–DV3 is shown. Here, the read word line pump 48 of FIG. 2 is replaced by two read word line pumps 17 and 18. The high $V_{cc}$ voltage detector, 11, monitors the voltage level of $V_{cc}$. As long as $V_{cc}$ is set to a predetermined low voltage range, preferably 2.7 to 3.6 volts, it will send high a low power status signal, LPS, enabling the two read word line voltage pumps 17 and 18, a read gate voltage pump 19, a read oscillator 13 and a temperature insensitive current source 15. The temperature insensitive current source 15 outputs a control signal, VMIR, which directly controls the frequency of the read oscillator 13. If $V_{cc}$ is raised to a predetermined high voltage range, preferably 4.5 V or higher, meaning that a word line can be charged directly off of $V_{cc}$, then the high vcc voltage detector 11 will send low the LPS signal and thereby disable all three read voltage pumps 17–19, read oscillator 13, and temperature insensitive current source 15.

Signals AX0, AX1, and XPDn are part of a partially predecoded memory cell address corresponding to a word line identifying a row of memory cells. Signals AX0 and AX1 are fed to the XHV decoder, 27, which generates four decoded signals XHV0–XHV3. Signals XHV0–XHV3 control the high voltage decoder 25 which selectively transfers the pump high voltage line, PHV, to one of its four outputs, DV0–DV3, and places the VS grounding signal on the remaining three outputs.

The VS grounding line has a voltage potential slightly higher than solid ground, preferably 0.3 V. It is generated by the VS generator 29 and is used to assure accurate operation of native n-type transistors such as the native n-type pass devices PAn.

Unlike regular enhancement mode n-type transistors which have a threshold voltage higher than zero volts, typically 1 volt, native n-type transistors have a threshold voltage of zero volts. Under normal operating conditions, a regular enhancement mode n-type transistor having its source grounded would be placed in a fully "off" state by applying zero volts to its control gate. Under the same conditions, however, a native n-type transistor with zero volts applied to its control gate would not be in a fully "off" state. In n-type transistors, the majority current carriers are electrons which, when an inversion layer exists, move inherently from the electrode of lower potential, the source, toward the electrode of higher potential, the drain. In the case of the native n-type pass devices PAn, the transistor electrode connected to an output of the high voltage decoder, DV0–DV3, would be at a higher potential than the other electrode. This means that the electrode connected to an output of the high voltage decoder, DV0–DV3, is the drain and therefore the other electrode would be the source. One of the requirements needed for a transistor to be in a fully "off" state is that the voltage from the control gate to the source electrode must be lower than the threshold voltage of the transistor. In the case of a native n-type transistor, the threshold voltage is zero volts, and so a negative voltage is needed from the control gate to source electrode. For a negative voltage to exist when zero volts are applied to the control gate, the source electrode must be raised to a potential higher than zero volts. By raising the voltage at the source electrode to the value of the VS line, 0.3 V, a voltage drop of –0.3 V is created from the control gate to the source electrode. This voltage drop is lower than the threshold voltage of the native n-type transistor and thereby puts native n-type pass devices PAn in the desired fully "off" state.

When active, the read oscillator 13 will maintain a relatively constant frequency in spite of any temperature or $V_{cc}$ level variations that may occur. This is due to the temperature insensitive current source 15 which directly controls the frequency of the read oscillator 13. Since the frequency of the read oscillator 13 does not deviate much, neither does its power consumption. The read oscillator 13 generates signals OSC1–OSC3 to control the pumping action of all three read voltage pumps 17–19.

Each read voltage pump 17–19 places charge onto a corresponding internal storage capacitor whenever its control signal, OSC1–OSC3, is high. The first and second read word line voltage pumps 17 and 18 together generate a high voltage on the pump high voltage line, PHV, which is transferred through the high voltage decoder 25 and pass devices 35 to a word line, WL0n–WL3n. Read gate voltage pump 19 generates high voltage signal RGPV which is applied through voltage latch VLN, 33, to the control gate of each native pass device PAn.

To conserve energy, when the memory is not being read, it enters a standby mode during which it turns off nonessential circuitry such as the read oscillator 13, temperature insensitive current source 15, and read voltage pumps 17–19. When a system user initiates a read instruction, the memory must turn on all circuitry needed for a read operation including the aforementioned read oscillator 13, temperature insensitive current source 15, and read voltage pumps 17–19. The speed at which these devices are activated will greatly impact the read access time of the memory. When the read oscillator 13 is first activated, it may begin with a low half of its cycle. The read voltage pumps 17–19 collect charge during a low half of the read oscillator's cycle, and transfer the collected charge onto internal storage capacitors, used to raise the voltage on their output, during a high half of the read oscillator's cycle. This means that the storage capacitors may receive no charge for as much as half of the read oscillator's initial cycle.

For this reason, control signals going from the read oscillator 13 to read word line voltage pumps 17 and 18, OSC1 and OSC2 respectively, are of similar frequency but of opposite phase. That is, when OSC1 is high, OSC2 is low, and when OSC2 is high, OSC1 is low. In this way, one of the two read word line voltage pumps, 17 or 18, will transfer charge onto its internal storage capacitor during either half of the read oscillator's cycle. Thus, one of the two read word line voltage pumps, 17 or 18, will initiate the transfer of charge onto its output coincident with the initial activation of the read oscillator 13, and thereby help the memory respond more quickly to a read instruction and reduce the read access time of the memory.

The outputs of read word line voltage pumps 17 and 18 are tied together to form the pump high voltage signal, PHV, which is connected to the high voltage decoder 25. When the read word line voltage pumps 17 and 18 are deactivated, line PHV is allowed to discharge to $V_{cc}$ through a native n-type transistor configured to form clamping diode 24. Independent programming pump 23, having its own programming oscillator, not shown, and used solely during a programming operation, also has its output tied to the same PHV signal. This is unlike much of prior art where the read word line voltage and program word line voltage follow different signal paths.

As stated earlier, the high voltage decoder 25 transfers the PHV signal to one of its four outputs, DV0–DV3, and places the VS signal on the other three as determined by the decoded input signal XHV0–XHV3 and its input VS signal. Only one of the XHV0–XHV3 signals may be high at any one time, and so if XHV0 is high, then PHV will be transferred to DV0. If XHV1 is high, then PHV will be transferred to DV1 and so on up to XHV3.

Figure 5:
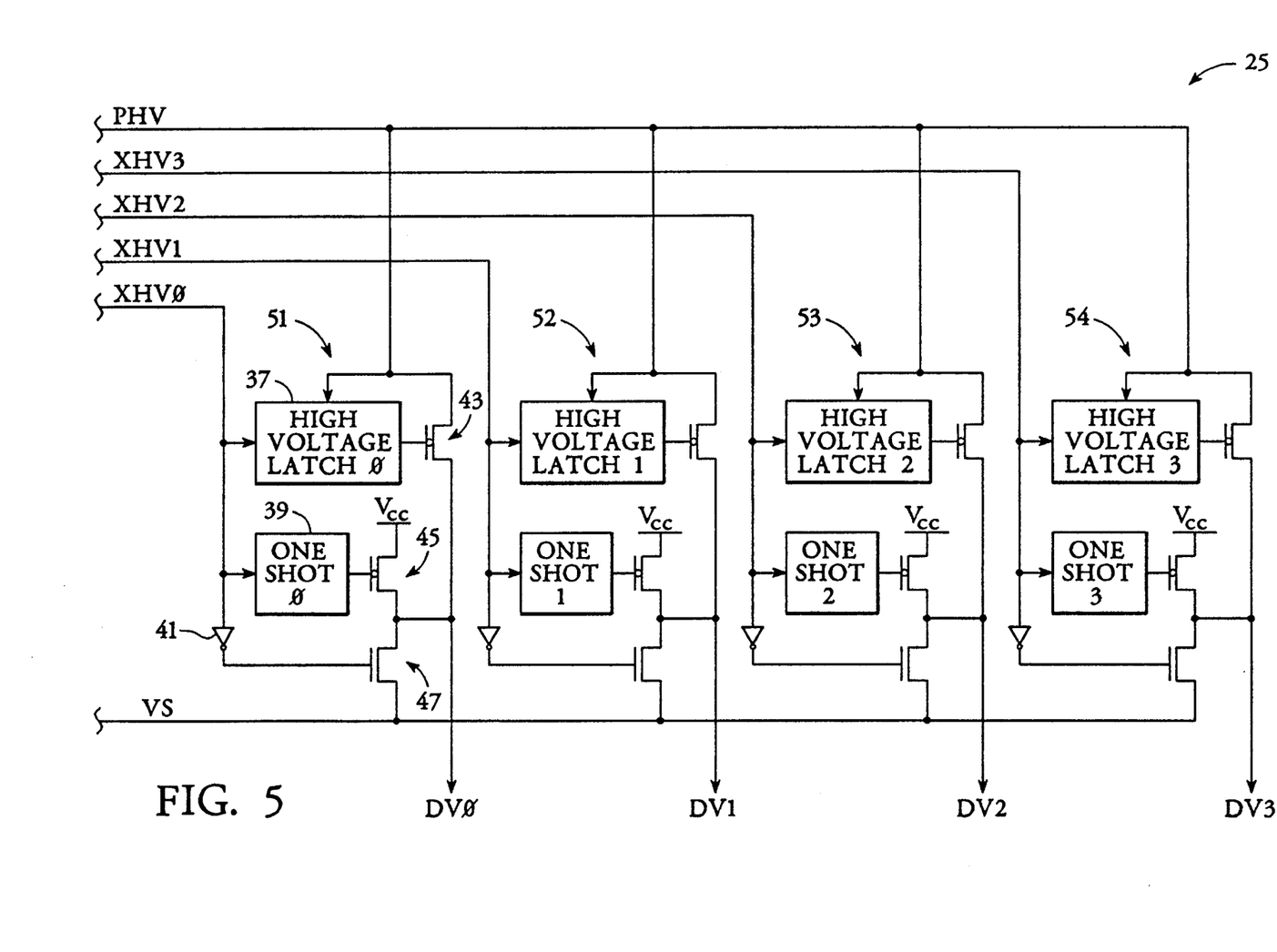
FIG. 5 is a block diagram of a high voltage decoder as shown in FIG. 4 in accord with the present invention.

As seen in FIG. 5, the high voltage decoder 25 consists of four units 51–54 with each unit consisting of a high voltage latch 37, a one shot circuit 39, an inverter 41, an enhancement mode n-type transistor 47, and two native n-type transistors 43 and 45. The PHV signal is connected to each high voltage latch 37 and to the drain of each corresponding native n-type transistor 43. When a decoded signal such as XHV0 is high, it activates the high voltage latch 37 which transfers the PHV signal to the control gate of native n-type transistor 43.

In order to pass the PHV signal with minimal distortion from the drain electrode of native n-type transistor 43 to its source electrode, signal DV0, the same PHV signals must be applied to the control gate of the native n-type transistor 43. One of the requirements needed for a transistor to be in an active "on" state is that the voltage from the control gate to the source electrode be equal to or greater than the threshold voltage of the transistor. In the present case, the threshold voltage of native n-type transistor 43 is zero volts, and therefore the control gate voltage must be at least equal to or greater than the source voltage. Thus, if the voltage value of PHV is to pass unimpeded from the drain electrode to the source electrode, the voltage value on the control gate must necessarily also be equal to PHV.

The decoded signal XHV0 is also connected to the one shot circuit 39 and inverter 41. An intrinsic time delay exists from the time the XHV0 line first enables the high voltage latch 37, and the time the high voltage latch 37 and native n-type transistor 43 begin transferring the PHV signal from the drain of native n-type transistor 43 to its source, the DV0 line. Furthermore, the PHV signal will require a set amount of time to have its voltage pumped to a value higher than $V_{cc}$.

The purpose of the one shot circuit 39 and inverter 41 is to precharge the DV0 line up to $V_{cc}$ and then to transfer control to the high voltage latch 37 and native n-type transistor 43 so that they may continue to charge the DV0 line to a value higher than $V_{cc}$. A high signal on XHV0 results in inverter 41 placing a low signal on transistor 47 causing it to isolate line DV0 from line VS. Additionally, a high signal on XHV0 activates the one shot circuit 39 causing it to initiate a high signal pulse of predetermined duration on the control gate of native n-type transistor 45. This high pulse will electrically couple the DV0 line to the $V_{cc}$ power rail for the duration of the pulse and thereby charge the DV0 line up to $V_{cc}$. If the high voltage latch 37 and native pass device 43 begin transferring a PHV signal of higher potential than $V_{cc}$ to the DV0 line during the time that the one shot circuit has a high pulse on transistor 45, then the PHV signal will also be electrically coupled through line DV0 and transistor 45 to $V_{cc}$. This will prevent line PHV from charging the DV0 line to a value higher than $V_{cc}$. Therefore, the duration of the active high pulse of the one shot circuit 39 must be long enough to precharge the DV0 line up to $V_{cc}$, but short enough that it is turned off by the time line PHV is pumped up to a value higher than $V_{cc}$.

If, on the other hand, decoded signal line XHV0 has a low signal, meaning that it is not selected, the one shot circuit 39 will maintain a constant low signal on native n-type transistor 45 and will not initiate a high pulse. Similarly, the high voltage latch 37 will maintain a constant low signal on native n-type transistor 43 and will not transfer the PHV signal to transistor 43's control gate.

Having a low signal, 0 V, on the control gates of native n-type transistors 43 and 45 will not necessarily place them in a fully "off" state. To properly turn off these devices, their source electrode must be at a higher potential than their control gate. To this end, inverter 41 applies a high signal on transistor 47 coupling line VS, which carries a voltage value of about 0.3 V, to line DV0 and consequently to the source electrodes of native n-type transistors 43 and 45.

Thus, one of the outputs, DV0–DV3, of the high voltage decoder 25 will have a voltage value similar to PHV and the other three outputs will have a voltage value similar to VS.

Before lines DV0–DV3 can be transferred to word lines WL0n–WL3n, however, they must first go through one of the corresponding native n-type pass devices PAn, as shown in FIG. 4. The native n-type pass devices PAn get their control gate signals from voltage latch Vln, 33, which gets its inputs from read gate voltage pump 19 and the predecoded X-pass device address signal XPDn.

Like read word line voltage pumps 17 and 18, read gate voltage pump 19 receives its control signal, OSC3, from read oscillator 13 and an enable signal, LPS, from the high $V_{cc}$ voltage detector 11. However, read gate voltage pump 19 also receives an additional enable signal, CLMP, from a feedback controlled voltage clamp 21 and places its output value on its read gate pump voltage line, RGPV. Its output, RGPV, goes not only to voltage latch VLn, but also to the feedback controlled voltage clamp 21.

During a read operation, it is important that the voltage on a word line WL0n–WL3n, and thereby the voltage on a memory cell, not be raised much higher than 5.5 volts or the memory cell may give false data or even have its stored data altered. The voltage on a word line, WL0n–WL3n, is made to be substantially similar to the voltage on the RGPV line, as explained below. Therefore, the voltage level on line RGPV is regulated to a predetermined voltage range of preferably 3.5 V to 5.5 V by feed back controlled voltage clamp 21, clamping diode 20, inverter 26 and leaker transistor 22.

The feedback controlled voltage clamp 21 consists of a voltage detector, not shown, and when the voltage on RGPV rises above the preferred predetermined voltage range of 3.5 to 5.5 volts, the feed back controlled voltage clamp 21 issues a low signal on the CLMP line. This low CLMP signal on read gate voltage pump 19 causes it to internally override the OSC3 control signal and stops the pump, which allows line RGPV to begin discharging to a low voltage through leaker transistor 22, whose gate is controlled by the output of inverter 26 with input from the CLMP line. Leaker transistor 22 speeds up the discharging of line RGPV to reduce the time during which line RGPV is at a voltage high enough to be detrimental to a memory cell. Clamping diode 20, made up of a native n-type transistor, prevents line RGPV from discharging below $V_{cc}$. When RGPV falls to its aforementioned predetermined voltage range, the feedback controlled voltage clamp 21 reactivates read gate voltage pump 19 by applying a high signal on the CLMP line which also turns off leaker transistor 22. Using the feedback controlled voltage clamp 21 to deactivate the read gate voltage pump 19 when its output goes above a predetermined value instead of using an upper limit clamping diode, as is the usual prior art method of clamping a voltage pump, lowers the memory's power consumption. If an upper limit clamping diode were used, then the read gate pump 19 would be constantly active during a read operation. Since the voltage on line RGPV would be clamped, for example, to 5.5 V, all excess charge generated by read gate pump 19 would be wastefully sent to the $V_{cc}$ power rail instead of to the charging of line RGPV.

A low signal on line XPDn causes voltage latch VLn, 33, to transfer the voltage on line RGPV to the control gates of the native n-type pass devices PAn, and further turns off pass devices PBn which isolate the word lines WL0n–WL3n from the VS generator 29. Since the native n-type pass devices PAn are native n-type transistors, the voltage on their source electrodes cannot be higher than the voltage on their control gates when they are in an active "on" state as was explained above. Therefore, even if the voltage on their drain electrodes, lines DV0–DV3, is much higher than the voltage on their control gates, the voltage value transferred from their drain electrodes, DV0–DV3, to their source electrodes, WL0n–WL3n, is limited to the voltage value on their control gates. In this manner, the voltage level on a word line, WL0–WL3, is clamped to the same level as line RGPV.

Also, before the voltage on line PHV is transferred to one of the lines DV0–DV3, it has to wait for the XHV decoder 27 to decode lines AX0 and AX1 and for the high voltage decoder 25 to select an output, while the voltage on line RGPV is transferred directly through voltage latch VLn, 33, to the control gates of the native n-type pass devices PAn as soon as the XPDn line goes low. As a result, the line connecting the output of voltage latch VLn to the control gate of the native n-type pass devices PAn is initially at a higher potential than the DV0–DV3 lines. Consequently, the DV0–DV3 signals are more quickly transferred to their corresponding WL0n–WL3n signals.

If the XPDn line is high, the voltage latch VLn will place 0 V on its output. Furthermore, a high signal on XPDn causes pass devices PBn 35 to couple line VS to the word lines WL0n–WL3n. This not only lowers the voltage on lines WL0n–WL3n to a value of VS, but as explained above, is necessary to properly turn off, and eliminate any current leakage from, the native n-type pass devices PAn.

Figure 6:
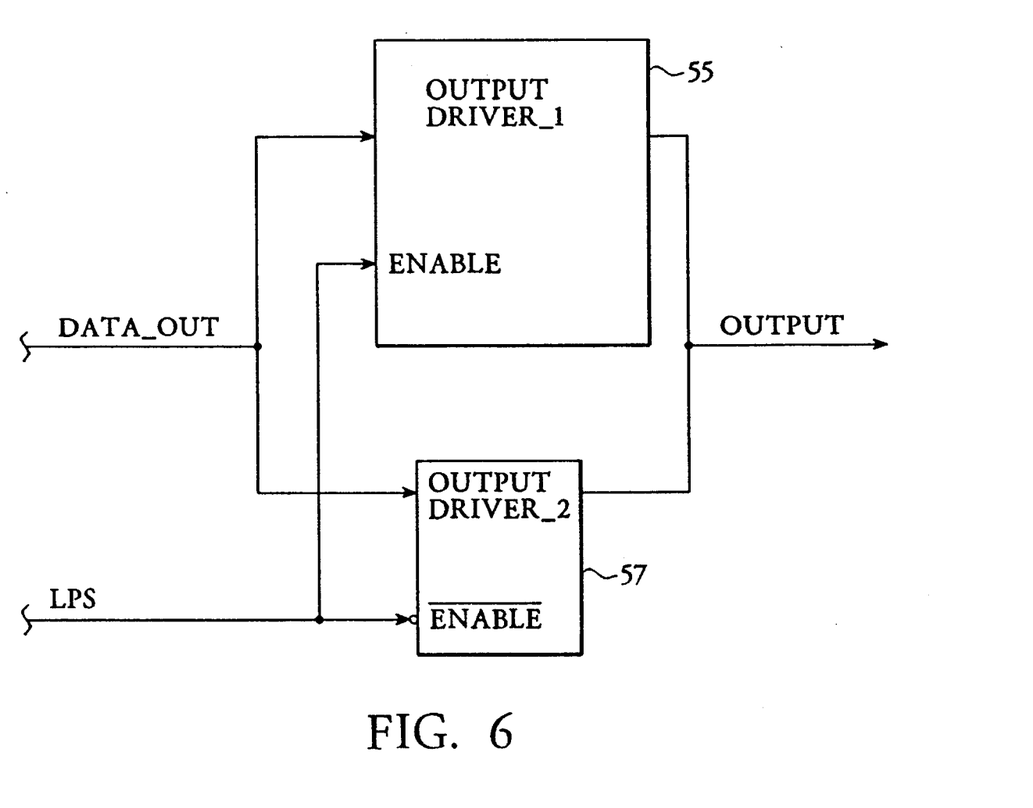
FIG. 6 is a block diagram of an output driver in accord with the present invention.

Since the memory in accord with the present invention is intended to function under both a low voltage $V_{cc}$ range of 2.7 to 3.6 volts and a standard 5 V vcc range of 4.5 or higher, it incorporates two output drivers per output signal. With reference to FIG. 6, a first output driver, 55, is made larger than a second output driver, 57, but both receive a common data signal, DATA—OUT, which is to be placed on the memory's OUTPUT lead. The first, and larger, output driver 55, is used when the memory is operating under low voltage $V_{cc}$ conditions and the second, and smaller, output driver 57 is used when the memory operates under standard $V_{cc}$ conditions of 4.5 v or higher. The smaller output driver 57 exhibits slower slew rates for its rise and fall times. This reduces noise problems of ringing and signal bouncing which can arise if the larger output driver 55, which has faster slew rates, is used under the same standard $V_{cc}$ conditions. To assure that only one output driver is active at a time, both receive the same LPS enable signal, but the first output driver 55 has an active high enable and the second output driver 57 has an active low enable. Therefore, when LPS is high, meaning that the memory is under low voltage $V_{cc}$ conditions, the first, and larger, output driver 55 is enabled and the second output driver 57 is disabled. But when LPS is low, meaning that the memory is under standard 5 V $V_{cc}$ conditions, the second, and smaller, output driver 57 is enabled and the first output driver 55 is disabled.

The present invention has been disclosed as applied to a low voltage EPROM, but the invention itself is a means for interfacing a low voltage memory with standard 5 V $V_{cc}$ components by incorporating a second slower output driver per output lead, and a means for improving the read-access time of said memory under low voltage $V_{cc}$ conditions by quickly raising the internal voltage level of a word line to a value higher than $V_{cc}$ during a read operation. A person versed in the art can apply the present invention without much deviation to other low voltage memories which use a word line to select a storage cell and determine the state of said storage cell by a measure of current through a corresponding bit line. For example, the present invention can be applied to low voltage EEPROMs or low voltage flash EEPROMs. Both of these memories share a data bit accessing scheme similar to that used in EPROMs which uses a word line and a bit line to activate a transistor through which stored information is read as a function of current on the bit line.

We claim:

1. A low voltage non-volatile memory comprising, a memory array of rows and columns of nonvolatile memory cells with each row identified by a word line and each column identified by a bit line and each cell addressable through a word line and a bit line, said bit lines coupled through sense amplifiers to output driving circuitry, and an input means associated with said array for initiating a read operation, said input means being coupled to an oscillator responsive to a read operation and coupled to a voltage pump circuit responsive to a read operation, said oscillator being coupled to a frequency control input of said voltage pump circuit, and said voltage pump circuit being coupled to a word line.

2. The memory of claim 1 further defined by a temperature insensitive current source having an output coupled to a frequency control input of said oscillator.

3. The memory of claim 1 wherein said voltage pump circuit consists of a first read voltage pump and a second read voltage pump working in conjunction with each other, said first read voltage pump receiving a first control signal from said oscillator and said second read voltage pump receiving a second control signal from said oscillator, said second control signal being of opposite phase as said first control signal, and said first read voltage pump, said second read voltage pump having a common output.

4. The memory of claim 1 wherein said voltage pump circuit is coupled to a word line via a high voltage decoder and pass device.

5. The memory of claim 4 further comprising a second voltage pump circuit responsive to a read operation and coupled through a voltage latch to a control input of said pass device.

6. The memory of claim 5 wherein said second voltage pump circuit is further coupled to an input of a voltage level detector for monitoring an output signal of said second voltage pump, said voltage level detector being coupled to an enable input of said second voltage pump circuit for deactivating said second voltage pump circuit when said output signal is above a predetermined value.

7. The memory of claim 6 wherein said pass device limits a voltage on a word line to a value substantially similar to said output signal of said second voltage pump circuit which is controlled by said voltage level detector.

8. The memory of claim 6 further comprising a controlled current leaking means for removing charge off said output signal when said voltage level detector deactivates said second voltage pump circuit.

9. The memory of claim 8 wherein said controlled current leaking means is an MOS transistor.

10. The memory of claim 4 wherein said pass device is a an n-type MOS transistor having a threshold voltage of zero volts.

11. The memory of claim 4 further comprising a low voltage generating circuit coupled to a control input of said high voltage decoder and said pass device for assuring proper deactivation of said high voltage decoder and pass device.

12. The memory of claim 4 wherein said high voltage decoder incorporates multiple input and output signal pairs, with an input of each input and output signal pair being coupled to an input of a separate corresponding one shot circuit and an output of each input and output signal pair being coupled to an output of said corresponding one shot circuit.

13. The memory of claim 1 further comprising a second input means for receiving a power signal and a voltage detecting means for monitoring said power signal, said voltage detecting means being coupled to selectively disable said voltage pump circuit and said oscillator when the power signal is above a predetermined voltage value.

14. The memory of claim 13 further comprising multiple output pins wherein said output driving circuitry comprises a first output driver and a second output driver per output pin, said first output driver having a first output signal coupled to a corresponding output pin and said second output driver having a second output signal coupled to the same corresponding output pin, said first and second output drivers receiving a common input signal, and said first output driver having faster rise and fall slew rates than said second output driver and being enabled when said power signal is below said predetermined voltage value, and said second output driver being enabled when said power signal is above said predetermined voltage value.

15. The memory of claim 1 wherein the memory is selected from the group consisting of an EPROM, an EEPROM, and a flash EEPROM.

16. A low voltage non-volatile memory comprising, a first input means for receiving a power signal, $V_{cc}$, and a main memory core connected to the first input means and configured as an array of rows and columns of non-volatile memory cells with each memory cell addressable through a word line and a bit line, said bit lines coupled through sense amplifiers to output driving circuitry, and a second input means for initiating read and program operations, said second input means being coupled to a first read voltage pump circuit for generating a first output voltage higher than $V_{cc}$ in response to a read operation, said second input means further coupled to a program voltage pump for generating a second output voltage higher than $V_{cc}$ in response to a program operation, said first output voltage and said second output voltage being connected together to form a high voltage signal, said high voltage signal being selectively coupled to a word line.

17. The memory of claim 16 further comprising a temperature insensitive oscillator coupled to said second input means and responsive to a read operation, said temperature insensitive oscillator further being coupled to said first read voltage pump circuit for controlling a charge pumping frequency of said first read pump circuit.

18. The memory of claim 17 wherein said first read voltage pump circuit comprises a first voltage pump receiving a first frequency control input from said temperature insensitive oscillator and a second voltage pump receiving a second frequency control input from said temperature insensitive oscillator, said second frequency control input being of opposite phase as said first frequency control input, and said first and second voltage pumps having a common output forming said first output voltage.

19. The memory of claim 18 wherein said high voltage signal is coupled to a word line via a high voltage decoder and a pass device, and further comprising a second read voltage pump circuit coupled to said second input means and responsive to a read operation, said second read voltage pump circuit having a third output voltage higher than $V_{cc}$ and coupled to a control input of said pass device.

20. The memory of claim 16 wherein said high voltage signal is coupled to a word line via a high voltage decoder and a pass device.

21. The memory of claim 20 wherein said high voltage decoder incorporates multiple pairs of high voltage latches and one shot circuits with an input of each high voltage latch being coupled to an input of its corresponding one shot circuit and an output of each high voltage latch being coupled to an output of its corresponding one shot circuit.

22. The memory of claim 20 wherein said pass device is a an n-type MOS transistor having a threshold voltage of zero volts.

23. The memory of claim 20 further comprising a low voltage generating circuit coupled to said high voltage decoder and said pass device for assuring full deactivation of said high voltage decoder and pass device.

24. The memory of claim 20 further comprising a second read voltage pump circuit coupled to said second input means and responsive to a read operation, said second read voltage pump circuit having a third output voltage higher than $V_{cc}$ coupled to a control input of said pass device.

25. The circuit of claim 24 wherein said second read voltage pump circuit is coupled to said pass device via a voltage latch.

26. The circuit of claim 24 further comprising a voltage detecting means for monitoring said third output voltage, said voltage detecting means being coupled to an enable input of said second read voltage pump circuit for selectively disabling said second read voltage pump circuit when said third output voltage rises above a predetermined value.

27. The circuit of claim 26 wherein said pass device limits a voltage on a word line to a value substantially similar to said third output voltage controlled by said voltage detecting means.

28. The circuit of claim 26 further comprising controlled current leaking means for discharging said third output voltage when said voltage detecting means disables said second read voltage pump.

29. The circuit of claim 28 wherein said controlled current leaking means is an MOS transistor.

30. The circuit of claim 24 further comprising a voltage detecting means for monitoring said power signal, said voltage detecting means being coupled to selectively disable said first and second read voltage pump circuits when the power signal is above a predetermined voltage value.

31. The circuit of claim 30 further comprising first and second clamping diodes coupling said first output voltage and said third output voltage to $V_{cc}$, respectively, when said power signal is above said predetermined voltage value.

32. The memory of claim 16 further comprising multiple output pins wherein said output driving circuitry comprises a first output driver and a second output driver per output pin, each said first and second output drivers receiving a common input signal and having output signals tied to a common corresponding pin, and said first output driver further having faster rise and fall slew rates than said second output driver and being enabled when said power signal is at a first predetermined voltage, and said second output driver being enabled when said power signal is at a second predetermined voltage higher than said first predetermined voltage.

33. The memory of claim 16 wherein the memory is selected from the group consisting of an EPROM, an EEPROM, and a flash EEPROM.

34. A low voltage non-volatile memory comprising;

a first input means for receiving a power signal, $V_{cc}$, multiple output pins, and a main memory core coupled to said first input means and configured as an array of rows and columsn of non-volatile memory cells with each cell addressable through a word line and a bit line, said bit lines coupled through sense amplifiers and output driving circuitry to said output pins, said output driving circuitry including a pair of first and second output drivers per output pin, both first and second output drivers receiving a common input signal and each pair of output drivers having output signals tied to a common corresponding output pin, said first output driver having faster rise and fall slew rates than said second output driver and being enabled when said power signal is at a first predetermined voltage, said second output driver being enabled when said power signal is at a second predetermined voltage higher than said first predetermined voltage.

* * * * *